(12) United States Patent
Wang et al.

(10) Patent No.: US 8,847,104 B2
(45) Date of Patent: Sep. 30, 2014

(54) WAFER CUTTING METHOD AND A SYSTEM THEREOF

(75) Inventors: Zhongke Wang, Singapore (SG); Tao Chen, Singapore (SG); Hongyu Zheng, Singapore (SG)

(73) Assignee: Agency for Science Technology and Research, Connexis (SG)

( * ) Notice: Subject to any disclaimer, the term of this patent is extended or adjusted under 35 U.S.C. 154(b) by 269 days.

(21) Appl. No.: 13/132,835

(22) PCT Filed: Dec. 4, 2009

(86) PCT No.: PCT/SG2009/000467
§ 371 (c)(1),
(2), (4) Date: Jun. 3, 2011

(87) PCT Pub. No.: WO2010/064997
PCT Pub. Date: Jun. 10, 2010

(65) Prior Publication Data
US 2011/0244659 A1  Oct. 6, 2011

(30) Foreign Application Priority Data

Dec. 5, 2008 (SG) .............................. 200809032-6
Jun. 12, 2009 (SG) .............................. 200904047-8

(51) Int. Cl.
| B23K 26/00 | (2014.01) |
| B23K 26/14 | (2014.01) |
| B23K 26/02 | (2014.01) |
| B23K 26/40 | (2014.01) |
| H01L 21/78 | (2006.01) |

(52) U.S. Cl.
CPC ............ *H01L 21/78* (2013.01); *B23K 26/4075* (2013.01); *B23K 2201/40* (2013.01)
USPC .............. 219/121.6; 219/121.61; 219/121.67; 219/121.71; 219/121.72; 219/121.78

(58) Field of Classification Search
USPC .............. 219/121.6, 121.61, 121.67, 121.68, 219/121.71, 121.72, 121.78, 121.85; 438/463
See application file for complete search history.

(56) References Cited

U.S. PATENT DOCUMENTS

| 3,629,545 A | 12/1971 | Graham et al. |
| 5,928,526 A * | 7/1999 | Morley .......................... 216/65 |
| 6,236,446 B1 | 5/2001 | Izumi et al. |

(Continued)

OTHER PUBLICATIONS

International Patent Application No. PCT/SG209/000467, International Search Report dated Mar. 10, 2010, 4 pages.

(Continued)

*Primary Examiner* — Hsien Ming Lee
(74) *Attorney, Agent, or Firm* — Conley Rose, P.C.

(57) ABSTRACT

A method for cutting a semiconductor wafer by generating a crack within the wafer, and a system thereof, are provided. The method comprises irradiating a laser beam towards a surface of the wafer and converging the laser beam to form a focal point so that a focal volume defined by the focal point and a boundary of the laser beam within the wafer is formed. Energy encompassed within the focal volume causes the wafer located at the periphery of the focal volume to contract faster than the wafer located within the focal volume, thereby generating a crack within the wafer.

38 Claims, 7 Drawing Sheets

(56) References Cited

U.S. PATENT DOCUMENTS

| | | | |
|---|---|---|---|
| 7,763,526 B2 * | 7/2010 | Tamura et al. | 438/463 |
| 2005/0090077 A1 | 4/2005 | Nagai et al. | |
| 2005/0274702 A1 | 12/2005 | Deshi | |
| 2006/0258047 A1 * | 11/2006 | Nishiwaki et al. | 438/107 |
| 2007/0138155 A1 | 6/2007 | Zuehlke et al. | |

OTHER PUBLICATIONS

Sillanpaa, Jari et al., "Ultra Short Pulse Laser Meeting the Requirements for High Speed and High Quality Dicing of Low-k Wafers," 2005 IEEE/SEMI Advanced Semiconductor Manufacturing Conference, Munich Germany, Apr. 11-12, 2005, 3 pages.

* cited by examiner

WAFER CUTTING METHOD AND A SYSTEM THEREOF

CROSS-REFERENCE TO RELATED APPLICATION

This application claims the benefits of Singapore Patent Application No. 200809032-6 filed on 5 Dec. 2008 and 200904047-8 filed on 12 Jun. 2009, the entire contents of which are incorporated herein by reference.

FIELD OF INVENTION

The invention relates to a method for cutting or dicing a semiconductor wafer by generating a crack within the wafer, and a system thereof. More particularly, the method relates to cutting the wafer with a laser beam.

BACKGROUND TO THE INVENTION

The following discussion of the background to the invention is intended to facilitate an understanding of the present invention. However, it should be appreciated that the discussion is not an acknowledgment or admission that any of the material referred to was published, known or part of the common general knowledge in any jurisdiction as at the priority date of the application.

Semiconductor wafer cutting or dicing is a cutting operation that is being employed to separate a semiconductor wafer, commonly but not necessarily always a silicon wafer, into individual smaller semiconductor chips. Cutting a wafer into individual chips may be accomplished by a number of methods, such as with the use of blade saws. However, this conventional method poses few problems. Firstly, the blades are prone to wear over time. The cutting quality is therefore affected over time with the use of the same blade. The operator has to predict the useful life-span of the blade and to replace a new one at the end of its useful life. The premature blade replacement results in high equipment cost. Secondly, the cutting conditions, such as the force exerted, the cutting speed, the cutting depth and the cutting angles, have to be precisely controlled to prevent any fracture or crack on the surface of the wafer. Additionally, the cutting process tends to create particles or chippings along the edges of the cutting path. As technology advances and the demand for miniature semiconductor devices increases, the need for thinner wafers also increases. This poses a serious challenge to convention blade-saw cutting method because direct mechanical cutting of a thin wafer inevitably introduces mechanical stress into the thin wafer and the thin wafer is more likely to experience fracture than a thicker wafer.

An alternative widely adopted cutting method to blade-saw cutting is laser cutting, which is a non-contact cutting process. Unlike the blade-saw cutting process, no mechanical stress is introduced into the wafer with the use of the non-contact laser cutting method. The use of different lasers, such as Q-switched 1,064 nm Nd:YAG lasers and their harmonics, UV lasers and with short pulse for a high optical absorption or a multi-photonic action with silicon for laser processing of a silicon wafer is well known to those of skilled in the art. Generally, laser beams focus on the target in a relatively short time and release energy simultaneously. Chemical bonds in the target material are broken by the photochemical action of the laser beam and cutting may be achieved by moving the scanning laser beam or the working platform to produce the desired shape. Due to the photochemical action of the laser beam to break the bonds in the silicon wafer, debris comprising deposits of silicon are produced on the surface of the wafer. The presence of the debris greatly reduces the quality of wafer. The debris has to be thoroughly removed in order to avoid failures in the subsequent packaging operations.

In an attempt to remove the debris produced by laser cutting, the use of assist gas comprising nitrogen, argon, air, oxygen or a mixture thereof has been proposed. For example, a first assist gas is supplied to a surface of a wafer during a first cutting phase and a second assist gas is subsequently supplied to the surface of the wafer during a second subsequent cutting phase. Silicon deposits, when formed, will be quickly removed by the assist gas thereby minimizing the deposition of silicon on the surface of the wafer.

In another attempt, the cutting of a silicon wafer is conducted in the presence of assist gas comprising sulfur hexafluoride ($SF_6$). The laser beam is focused onto the silicon wafer surface at a power density above the ablation threshold of silicon so that the assist gas reacts with the silicon to form gaseous silicon tetrafluoride ($SiF_4$). The deposition of silicon on wafer surface is therefore minimized. However, the use of assist gas translates to higher operating and material costs which render this approach less attractive.

The use of water jet-guided laser beam is another proposed method for cutting a silicon wafer. Water jet-guided laser is primarily based on guiding a laser beam inside a fine water jet. Because of the difference in the reflection coefficient of water and air, the laser beam is fully reflected at the water-jet surface, similar to the operation of an optical fiber. The advantage of this water jet-guided laser beam combination over the conventional laser cutting is that debris produced during the laser cutting is simultaneously removed from the cutting path due to the washout of the high pressurized water jet. This eliminates the need for assist gas. However, the presence of water is not desirable when cutting wafers with integrated circuits. Indeed, it is often required to avoid, if not minimize, the presence of water during laser cutting of a silicon wafer.

To-date, laser-cutting methods for separating a semiconductor wafer into individual semiconductor chips remain a satisfactory and convenient option compared to mechanical blade-saw cutting method. Despite this, existing laser-cutting methods pose a problem of debris contaminants depositing onto the wafer surface after cutting, which deposition eventually leads to the degradation of the resultant semiconductor device properties. Further, additional or post-treatment processes are often needed to remove the debris from the wafer surface, which may be complicated and time consuming.

The trend of electronic devices is moving towards higher speed, more integrated functions and compact volume. The conventional integrated circuit structure is inadequate to satisfy the ever-growing demand for higher performances. Better performing integrated circuits mandate thinner silicon substrate and the introduction of new materials or structures into the electronic devices. A thin silicon wafer is desired for several reasons. Thinner wafers facilitate the stacking of circuits, which directly leads to the increase in circuit density. By reducing the thickness of silicon bulk, the device is moving closer to the metal heat sink so that heat conducts away from the active area more effectively, which is critical for high-frequency operation. The mechanical flexibility of thin wafers is ideal for flexible systems, such as smart cards, chip-in-paper and contactless label. Today, the chip thickness is less than 250 µm and will be further reduced. Traditionally, a diamond saw blade is used to dice the wafer. Because of the contact nature of this technology, mechanical damages cannot be reduced without great sacrifice in the dicing speed. All the cutting conditions such as the force exerted, the cutting speed, the cutting depth and the cutting angles have to be well controlled properly to prevent any fracture or crack on the surface of the silicon wafer. Along with the reduced substrate thickness, new materials and structures are introduced to achieve the desired high performance, including inter-layer dielectric with a low dielectric constant, polyimide coating and copper interconnects. These new materials or structures have lower elastic modulus, lower mechanical strength and poorer adhesion between layers than the conventional silicon, which imposes serious difficulty in wafer dicing.

Therefore, it is desirable to provide a wafer cutting method and system that overcomes, or at least alleviates, the above problems.

SUMMARY OF THE INVENTION

Throughout this document, unless otherwise indicated to the contrary, the terms "comprising", "consisting of", and the like, are to be construed as non-exhaustive, or in other words, as meaning "including, but not limited to".

In a first aspect of the present invention, there is provided a method for cutting a semiconductor wafer by generating a crack within the wafer. The method comprises irradiating a laser beam towards a surface of the wafer and converging the laser beam to form a focal point so that a focal volume defined by the focal point and a boundary of the laser beam within the wafer is formed. Energy encompassed within the focal volume causes the wafer located at the periphery of the focal volume to contract faster than the wafer located within the focal volume, thereby generating a crack within the wafer. Preferably, the irradiating comprises irradiating a laser beam having a laser power density lower than the vapourisation threshold of the wafer ablation.

In a second aspect of the present invention, there is provided a system for cutting a semiconductor wafer by generating a crack within the wafer. The system comprises a laser beam source for irradiating a laser beam towards a surface of the wafer and a converging lens to converge the laser beam to form a focal point so that a focal volume defined by the focal point and a boundary of the laser beam within the wafer is formed. Energy encompassed within the focal volume causes the wafer located at the periphery of the focal volume to contract faster than the wafer located within the focal volume, thereby generating a crack within the wafer.

BRIEF DESCRIPTION OF THE DRAWINGS

In the figures, which illustrate, by way of example only, embodiments of the present invention.

DETAILED DESCRIPTION

The invention relates to a method for cutting or dicing a semiconductor wafer by generating a crack within the wafer, and a system thereof. The semiconductor wafer includes, but is not limited to, silicon (Si), Si coated with a thin layer of oxide, nitride, carbide, or metal, gallium arsenide (GaAs), silicon carbide (SiC), silicon nitride (SiN), and indium phosphide (InP). Preferably, the wafer is silicon.

Figure 1:
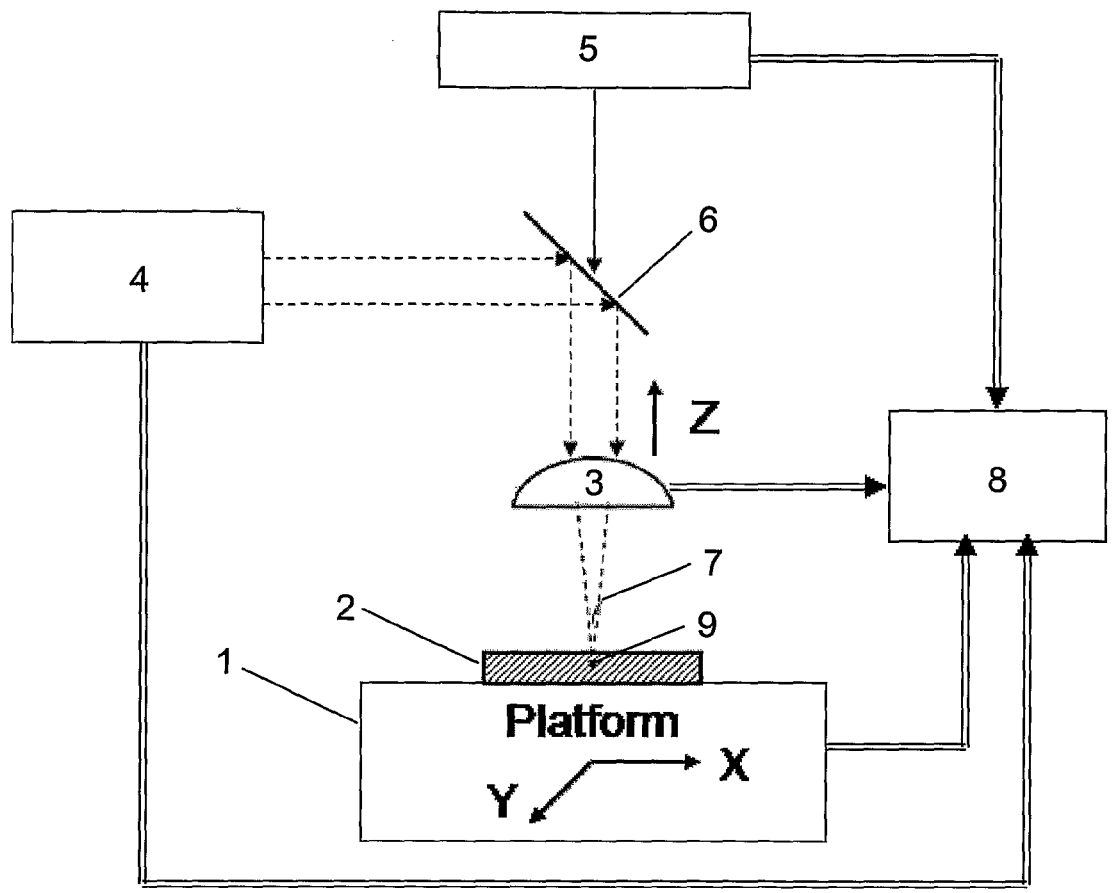
FIG. 1 shows a schematic view of the system for laser-cutting a wafer according to a first aspect of the present invention.

In accordance with a first embodiment of the invention illustrated in FIG. 1, there is provided a platform table 1 for holding and moving a silicon wafer 2 to be cut into individual silicon chips. The platform table 1 is capable of moving in the x-y axis via manipulation of a control device 8, such as a computer.

A laser beam source 4 is provided to irradiate a laser beam 7 onto a surface of the wafer 2 held on the platform table 1. The laser beam source 4 includes, but is not limited to, excimer laser, Nd:YAG laser, $CO_2$ laser, fiber laser, and any other near infrared laser. Preferably, the laser beam source 4 is a fiber laser.

Optionally, a laser beam guide 6 is provided to guide the laser beam 7 irradiated from the laser beam source 4 towards the surface of the wafer 2, the laser beam 7 passing through a focusing lens 3. The laser beam guide 6 may be a flat reflecting mirror, positioned at an angle to reflect the direction of the laser beam 7.

The focusing lens 3 is provided to converge the laser beam 7 irradiated from the laser beam source 4, or reflected from the laser beam guide 6, to form a focal point 9 below the surface of the wafer 2 so that a focal volume defined by the focal point 9 and a boundary of the laser beam 7 within the wafer 2 is formed. It is illustrated in this embodiment that the focal point is located below the surface of and within the wafer. It is to be understood and appreciated that the location of the focal point is not restricted as such, and alternative locations of the focal point are also possible, which will be described later.

Advantageously, a monitoring device 5, such as a CCD monitor, is provided to observe the positioning of the laser beam 7 on the wafer 2 and the focal point 9 below the surface of the wafer 2. The observation made by the monitoring device 5 is fed to the control device 8 so that any corrective action, such as the need to re-adjust the position of the wafer 2 held on the platform table 1 by moving the platform table 1 in the x-y direction, or the need to re-adjust the focal length of the laser beam 7 by moving the focusing lens 3 in the z-direction, is taken to achieve the desired predetermined position of the laser beam 7 on the wafer 2 and the focal point 9.

Figure 2:
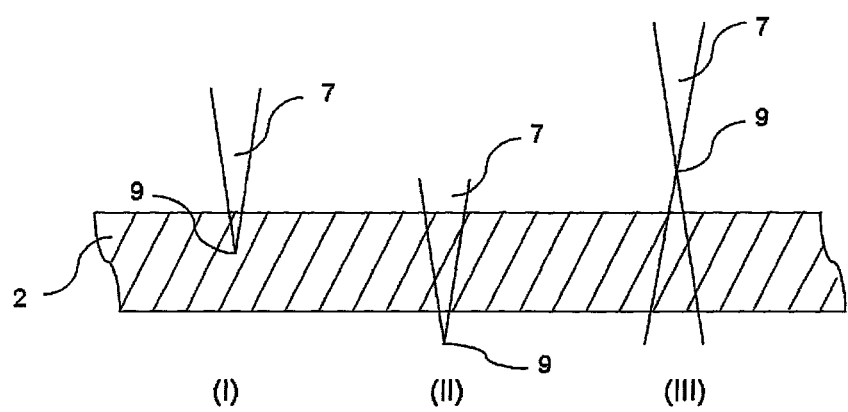
FIG. 2 illustrates the focusing of a laser beam where (I) the focal point is formed below the surface of and within a wafer, (II) the focal point is formed below and outside the wafer, and (III) the focal point is formed above the surface of and outside the wafer according to the present invention.

FIG. 2 illustrates the focusing of a laser beam 7 where (I) the focal point 9 is formed below the surface of and within the wafer 2, (II) the focal point 9 is formed below and outside the wafer 2, and (III) the focal point 9 is formed above the surface of and outside the wafer 2. Any location of the focal point 9 is suitable so long as the focal volume defined by the focal point 9 and the boundary of the laser beam 7 is formed within the wafer 2 to generate a crack. Typically, the wafer 2 has a thickness ranging from 100 μm to 1,500 ∞m. In one preferred embodiment, the focal point 9 is formed at half or more than half of the wafer 2 thickness below the surface of the wafer 2. More preferably, the focal point 9 is formed 150 μm to 200 μm below the surface of the wafer 2 when the wafer 2 thickness is 500 μm.

Figure 3:
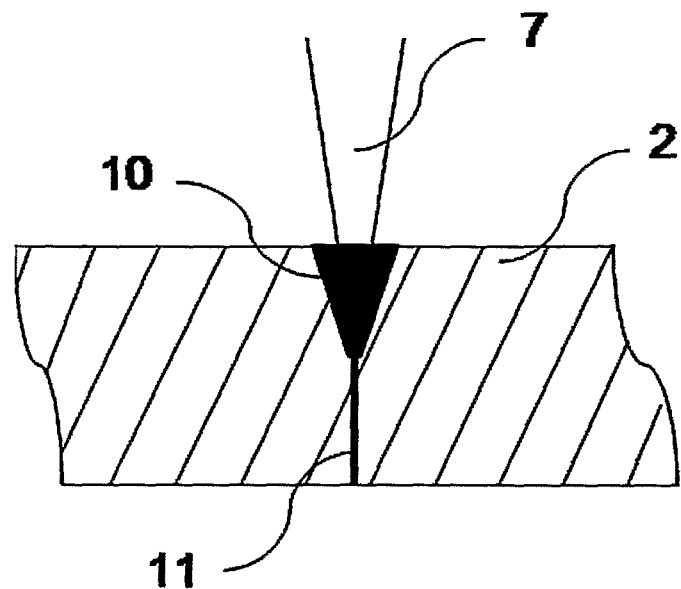
FIG. 3 illustrates the phenomenon of the generation of crack within the wafer according to the present invention.

FIG. 3 illustrates the phenomenon of the generation of crack within the silicon wafer 2 according to an embodiment of the present invention. In this embodiment, which corresponds to situation (I) illustrated in FIG. 2, the laser beam 7 is focused to form the focal point 9 (not shown) below the surface of and within the wafer 2 so that energy encompassed within the focal volume causes the wafer 2 located at the periphery of the focal volume to melt slower but to solidify faster and therefore to contract faster than the wafer 2 located within the focal volume, thereby generating a crack within the wafer 2. When the focal point 9 is formed above the surface of and outside the wafer 2 corresponding to situation (III) of FIG. 2, a thermally induced heating-cooling phenomenon occurs instead of the preferential melting-solidification phenomenon. Less energy is encompassed within the focal volume formed within the wafer 2 to initiate the melting process. The energy is insufficient to cause melting but is sufficient to induce thermal heating of the wafer 2 located at the periphery of the focal volume such that the wafer 2 located at the periphery of the focal volume heats up slower but cools down faster and therefore to contract faster than the wafer 2 located within the focal volume, thereby generating a crack within the wafer 2. When the focal point 9 is formed below and outside the wafer 2 corresponding to situation (II) of FIG. 2, either the melting-solidification phenomenon or the thermally induced heating-cooling phenomenon occurs, depending on the amount of energy encompassed within the focal volume, which energy in turn depends on the operating parameters of the laser beam. A melting (or heating) groove 10 defines the region within the wafer 2 where the preferential melting-solidification (or heating-cooling) of silicon occurs. The irradiating laser power density is less than $10^6$ W/cm$^2$ which is predetermined and controlled to be below the vapourisation threshold density of the wafer material ablation, for example, laser power density of 500 W/cm$^2$. In one embodiment, firstly, the fiber laser is an infrared beam with a wavelength of 1,090 nm which is more transparent than UV laser and visible laser. Suitable infrared wavelength also includes 1,064 nm to 1,550 nm. Secondly, the fiber laser has a long pulse duration time of 40 to 42 µs and a pulse repetition rate operating at 12 kHz. Suitable pulse duration also includes 20 µs to 80 µs and suitable pulse repetition rate also includes 5 kHz to 50 kHz. These laser beam parameters afford advantages for laser beam to induce melting or thermal heating rather than vapourisation ablation. Silicon, for instance, is highly absorptive to UV wavelengths, and usually, the short and/or ultra-short pulse leads to less heat treatment but mostly vapourisation. Therefore, the process of material vapourisation from the wafer is restrained due to the low laser power density or low pulse energy. Liquid-phase expulsion taught in the prior art is avoided since no gas jet is needed. Thus, the generation of debris on the wafer surface by laser ablation is avoided.

The laser beam 7 irradiated by the laser beam source 4 typically has a Gaussian distribution in terms of power density. The laser-induced melting or thermal heating occurs initially along the central plane of the focal volume (and therefore the melting or heating groove 10) since most of the energy encompassed by the focal volume is concentrated along the central plane. The energy is transmitted radially in decreasing amount of energy. As a consequence, silicon located at the periphery of the focal volume melts slower but solidifies faster (or heats up slower but cools down faster) and therefore to contract faster than silicon located within and along the central plane of the focal volume due to the fundamentals of solidification (or heating-cooling) theory. In other words, the rate of silicon melting (or heating) increases outwardly in the radial direction while the rate of silicon solidification (or cooling) increases inwardly in the radial direction. As a result of this preferential melting-solidification (or heating-cooling), during the final stage of solidification (or cooling), silicon located along the central plane of the focal volume has insufficient strength to withstand the contraction stresses generated by the neighbouring molten (or heated) silicon as the molten (or heated) silicon solidifies (cools) inwardly in the radial direction. Therefore, a crack 11 is produced during the melting-solidification process (or heating-cooling process) which initially propagates from the surface of the wafer 2 and then spreads to the bottom of the wafer 2, thereby allowing the cutting or dicing of the silicon wafer into individual silicon chips. The plane along which the crack is produced corresponds to the central plane of the focal volume. Furthermore, thermal effect zone is controlled within a single scan width of the pass due to the rapid moving of the wafer 2 relative to the laser beam 7.

Figure 4:
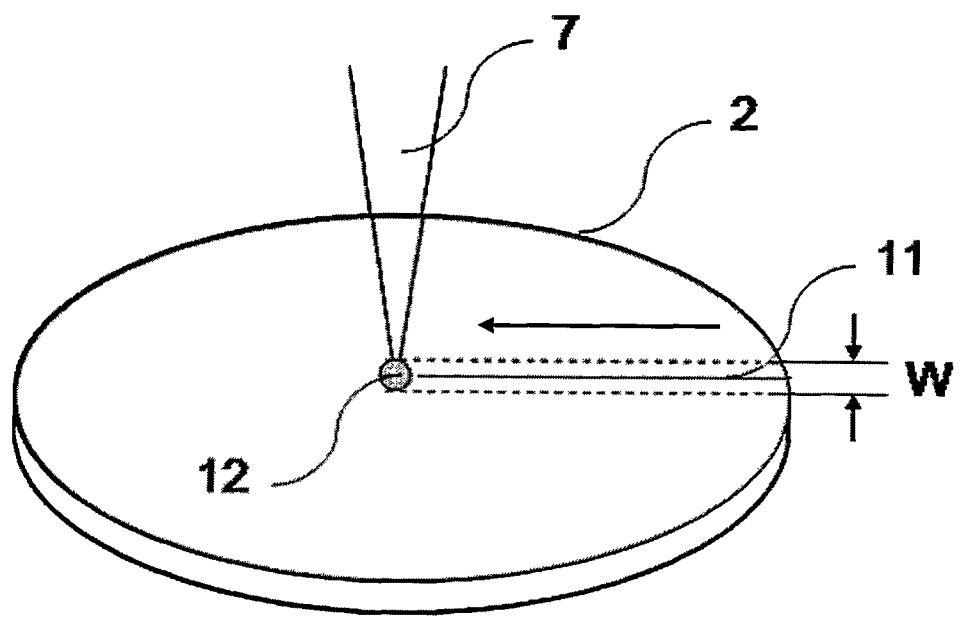
FIG. 4 illustrates the propagation of a laser-induced crack according to the present invention.

FIG. 3 demonstrates the phenomenon of the generation of crack at a localized spot 12 (not shown) without movement of the platform table 1. FIG. 4, on the other hand, illustrates the directional propagation of the laser-induced crack along the central line of a melting track according to an embodiment of the present invention. The laser beam 7 is scanned from one edge of the wafer 2 and moves towards the other opposing edge via the movement of the platform table 1 (not shown) controllable by the control device 8 (not shown). The initial localized crack generated at the localized spot 12 is gradually developed into a propagating crack following the directional movement of the moving spot 12. The crack line 11 corresponding to the melting track follows the preferential melting-solidification (or heating-cooling) phenomenon described previously.

Thermal effect zone is controlled within a single scan width of the laser scan pass due to the rapid movement of the wafer 2 relative to the laser beam 7. The total width W of the laser-induced melting track including the thermal effect zone is the melting belt width of a single scan pass of the laser beam 7. The other thermal effect region is significantly invisible in the laser beam 7 irradiation track except the melting belt, i.e. only the wafer constrained within the melting belt is melted (or heated), solidified (cooled) and cracked.

The width W is strongly dependent on the operating laser parameters during the cutting process. In one embodiment, when a focusing lens shown in FIG. 1 having a focal length of 50 mm is applied, the obtained width W for a wafer thickness of 500 µm is 120 µm at a scanning speed of 40 mm/s with a laser power of 200 W operating at a repetition rate of 12 kHz and a duty cycle of 50%. For the same wafer thickness, the width W is reduced with increasing scanning speed and decreasing laser power. In comparison, the obtained width W is 80 µm at a scanning speed of 60 mm/s with a laser power of 200 W operating at a repetition rate of 12 kHz and a duty cycle of 50% (pulse duration 41.6 µs). The obtained width W is 60 µm at a scanning speed of 60 mm/s with a laser power of 140 W operating at a repetition rate of 12 kHz and a duty cycle of 50%. Laser power, scanning speed and the pulse frequency are the output parameters of a laser beam source and are therefore the interactive parameters to determine the cutting speed and the melting belt width W. The moving speed of the wafer correlates with the output power of the laser beam. That is to say, when the output power is constant and the moving speed is low, the melting belt width W becomes wider. And when the moving speed is constant and the output power is high, the melting belt width W becomes wider. At low laser pulse frequency, e.g. 3 kHz, a rough edge of the melting belt is obtained due to discontinuous connections of the laser melting spot 12 at a scanning speed of 40 mm/s with a laser power of 200 W. At an even further low laser pulse frequency, e.g. 1 kHz, a melting belt cannot be achieved due to discontinuous connections of the laser melting spot 12 at a scanning speed of 40 mm/s with a laser power of 200 W. Furthermore, in this latter case, transverse cracks in the radial direction are produced. Therefore, this shows that the laser beam parameters should be carefully selected and if not chosen appropriately, it may result in a failed cutting operation for separating the wafer. Generally, a low laser power density of less than $10^4$ W/cm$^2$, for example, for a 500 μm thick wafer at a moving speed of 100 mm/s, is insufficient to obtain a melting groove. As a result, transverse cracks are generated instead.

Figure 5:
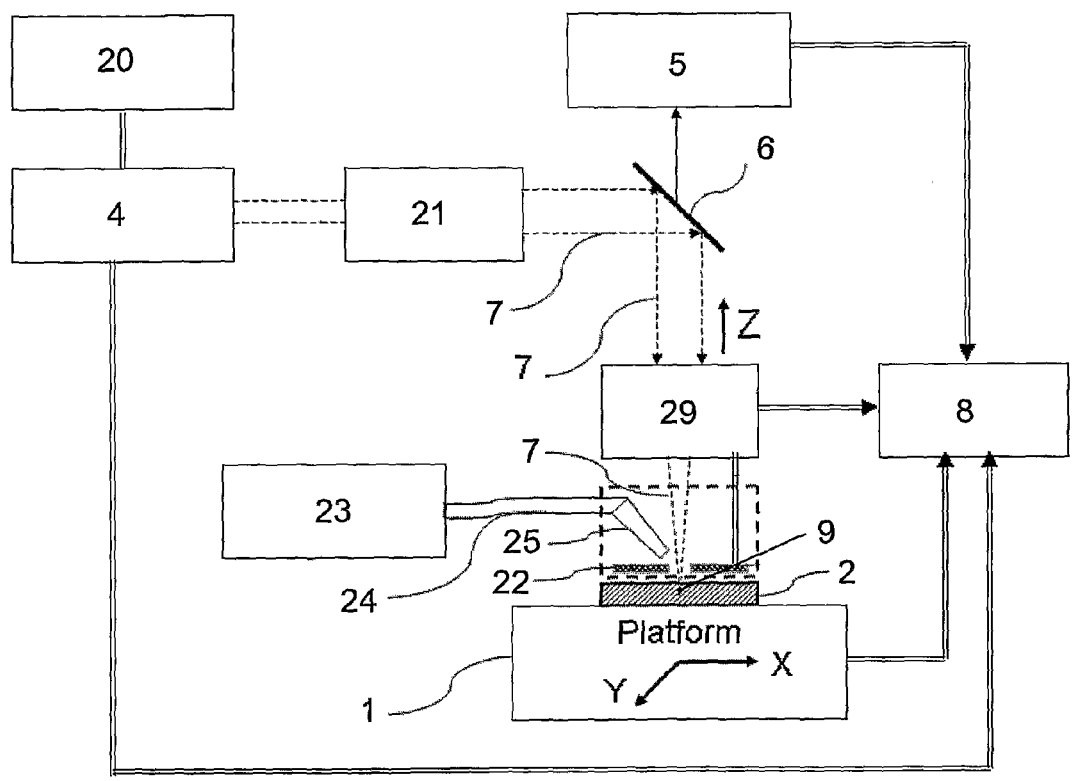
FIG. 5 shows a schematic view of the system for laser-cutting a wafer according to a second aspect of the present invention.

In accordance with a second embodiment of the invention illustrated in FIG. 5, there is provided a platform table 1 for holding and moving a silicon wafer 2 to be cut into individual silicon chips. The platform table 1 is capable of moving in the x-y axis via manipulation of a control device 8, such as a computer.

A laser beam source 4 is provided to irradiate a laser beam 7 onto a surface of the wafer 2 held on the platform table 1. The laser beam source 4 includes, but is not limited to, excimer laser, Nd:YAG laser, $CO_2$ laser, fiber laser, and any other near infrared laser. Preferably, the laser beam source 4 is a fiber laser.

Figure 6:
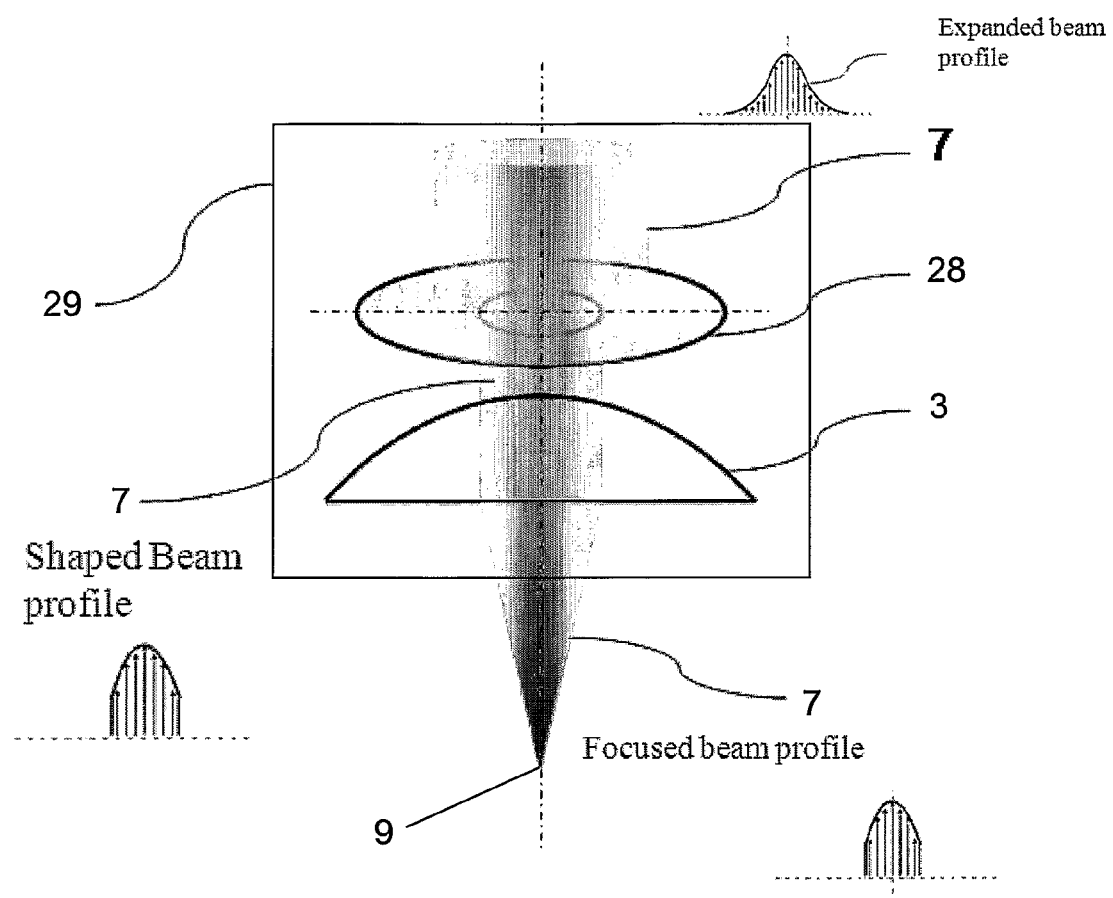
FIG. 6 illustrates the focusing of a laser beam via a beam shaper according to the present invention.

Optionally, a laser beam guide 6 is provided to guide the laser beam 7 irradiated from the laser beam source 4 towards the surface of the wafer 2, the laser beam 7 passing through a focusing lens 3 (FIG. 6). The laser beam guide 6 may be a flat reflecting mirror, positioned at an angle to reflect the direction of the laser beam 7.

The beam shaper 29 is provided to converge the laser beam 7 irradiated from the laser beam source 4, or reflected from the laser beam guide 6, to form a focal point 9 below the surface of the wafer 2 so that a focal volume defined by the focal point 9 and the boundary of the laser beam 7 within the wafer 2 is formed. FIG. 6 shows the beam shaper 29 comprising an aperture 28 and a focusing lens 3. The aperture diameter is adjustable to filter the outer portion of the laser beam 7 such that only a limited inner portion of the laser beam 7 may pass through the aperture 28. The size of the laser beam 7 is therefore reduced to a smaller diameter size laser beam 7 after passing through the aperture 28. The smaller diameter size laser beam 7 then passes through the focusing lens 3 and converges to form a focal point 9 below the surface of the wafer 2 (not shown). The focused laser beam 7 now has a smaller converging diameter on the surface of the wafer 2 (not shown) along the laser beam 7 propagation direction. The advantage of using the beam shaper 29 is to produce a smaller laser beam size having a more uniform and concentrated power distribution on the surface of the wafer 2 (not shown) thereby resulting in a minimized cut kerf and thermal effect. Accordingly, a changeable beam spatial profile can be achieved with the beam shaper 29. The laser beam 7 is shaped through the beam shaper 29 to match the various thicknesses (100 μm to 1,500 μm) of the wafer 2 (not shown) for the narrowest kerf.

Referring again to FIG. 5, advantageously, a monitoring device 5, such as a CCD monitor, is provided to observe the positioning of the laser beam 7 on the wafer 2 and the focal point 9 below the surface of the wafer 2. The observation made by the monitoring device 5 is fed to the control device 8 so that any corrective action, such as the need to re-adjust the position of the wafer 2 held on the platform table 1 by moving the platform table 1 in the x-y direction, or the need to re-adjust the focal length of the laser beam 7 by moving the focusing lens 3 (FIG. 6) in the z-direction, is taken to achieve the desired predetermined position of the laser beam 7 on the wafer 2 and the focal point 9.

Preferably, a laser pulse generator or modulator 20 is coupled to the laser beam source 4 to generate or modulate the pulse frequency of the laser beam 7. The laser pulse modulator 20 is used to tune the pulse shape, duration and repetition rate. Accordingly, the heat deposition onto the wafer 2 can be controlled with the laser pulse modulator 20 for wafer separation.

Figure 7:
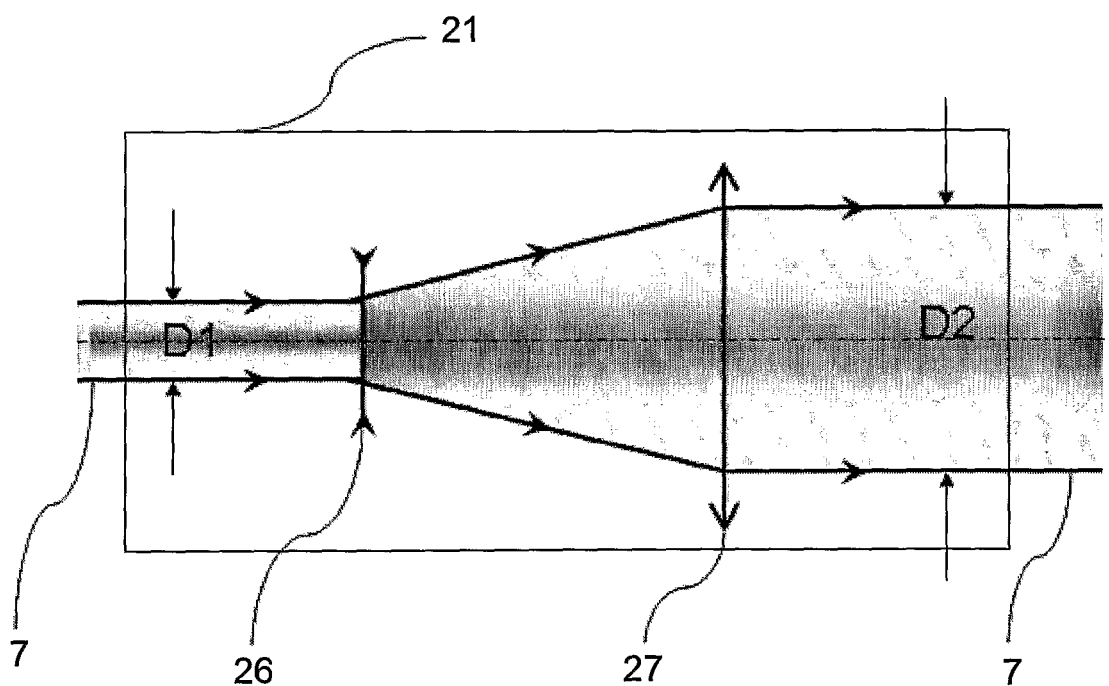
FIG. 7 illustrates the expansion of a laser beam via a beam expander according to the present invention.

Preferably, a beam expander 21 (2 to 8 times expansion) is positioned in the path of the laser beam 7 between the laser beam source 4 and the laser beam guide 6. The beam expander 21 causes the output laser beam 7 from the laser beam source 4 to expand. Referring to FIG. 7, the laser beam 7 emerging from the laser beam source 4 and entering the beam expander 21 is expanded to 2 to 8 times larger in diameter to form the laser beam 7 emerging from the beam expander 21. The beam expanding ratio is D2/D1 where D1 is the diameter of the laser beam 7 emerging from the laser beam source 4 and D2 is the diameter of the laser beam 7 emerging from the beam expander 21. The beam expanding ratio varies from 2 to 8. Preferably, the beam expander 21 comprises an entrance optics plano-concave lens 26 and an exit optics achromatic lens 27.

Referring again to FIG. 5, preferably, a shielding plate 22 is provided between the focusing lens 3 (FIG. 6) and the wafer 2. An aperture of 0.3 to 1 mm in diameter is provided in the shielding plate 22 such that the focused laser beam emerging from the focusing lens 3 passes through the aperture in the shielding plate 22 and is irradiated onto the wafer 2.

Preferably, a vacuum suction system is provided to suck the vapour and aerosols produced during the cutting process. More preferably, the vacuum suction system comprises a vacuum suction 23, a pipe 24 and a nozzle 25. The vacuum suction system and the shielding plate 22 are positioned above the surface of the wafer 2 to be irradiated. There remains a small gap, for example, 0.5 mm between the shielding plate 22 and the wafer 2. Vapour such as $SiO_2$ and melting droplets induced by the laser within the melting belt are extracted when produced, and plasma heating is reduced.

The phenomenon of the generation of crack within the wafer is similar to that described for the first aspect illustrated in FIG. 3. In one embodiment, which corresponds to situation (I) illustrated in FIG. 2, the laser beam 7 is focused to form the focal point 9 (not shown) below the surface of and within the wafer 2 so that energy encompassed within the focal volume causes the wafer 2 located at the periphery of the focal volume to melt slower but to solidify faster and therefore to contract faster than the wafer 2 located within the focal volume, thereby generating a crack within the wafer 2. When the focal point 9 is formed above the surface of and outside the wafer 2 corresponding to situation (III) of FIG. 2, a thermally induced heating-cooling phenomenon occurs instead of the preferential melting-solidification phenomenon. Less energy is encompassed within the focal volume formed within the wafer 2 to initiate the melting process. The energy is insufficient to cause melting but is sufficient to induce thermal heating of the wafer 2 located at the periphery of the focal volume such that the wafer 2 located at the periphery of the focal volume heats up slower but cools down faster and therefore to contract faster than the wafer 2 located within the focal volume, thereby generating a crack within the wafer 2. When the focal point 9 is formed below and outside the wafer 2 corresponding to situation (II) of FIG. 2, either the melting-solidification phenomenon or the thermally induced heating-cooling phenomenon occurs, depending on the amount of energy encompassed within the focal volume, which energy in turn depends on the operating parameters of the laser beam. A melting (or heating) groove 10 defines the region within the wafer 2 where the preferential melting-solidification (or heating-cooling) of silicon occurs. The irradiating laser power density is less than $10^6$ W/cm$^2$ which is predetermined and controlled to be below the vapourisation threshold density of the wafer material ablation. In one embodiment, firstly, the fiber laser is an infrared beam with a wavelength of 1,090 nm which is more transparent than UV laser and visible laser. Suitable infrared wavelength also includes 1,064 nm to 1,550 nm. Secondly, the fiber laser has a long pulse duration time of 40 to 42 μs and a pulse repetition rate operating at 12 kHz. Suitable pulse duration also includes 20 μs to 80 μs and suitable pulse repetition rate also includes 5 kHz to 50 kHz. These laser beam parameters afford advantages for laser beam to induce melting rather than vapourisation ablation. Silicon, for instance, is highly absorptive to UV wavelengths, and usually, the short and/or ultra-short pulse leads to less heat treatment but mostly vapourisation. Therefore, the process of material vapourisation from the wafer is restrained due to the low laser power density or low pulse energy. Liquid-phase expulsion taught in the prior art is avoided since no gas jet is needed. Thus, the generation of debris on the wafer surface by laser ablation is avoided.

The laser beam 7 irradiated by the laser beam source 4 typically has a Gaussian distribution in terms of power density. The laser-induced melting or thermal heating occurs initially along the central plane of the focal volume (and therefore the melting or heating groove 10) since most of the energy encompassed by the focal volume is concentrated along the central plane. The energy is transmitted radially in decreasing amount of energy. As a consequence, silicon located at the periphery of the focal volume melts (or heats up) slower but solidifies (or cools down) faster than silicon located within and along the central plane of the focal volume due to the fundamentals of solidification (or cooling) theory. In other words, the rate of silicon melting (or heating) increases outwardly in the radial direction while the rate of silicon solidification (or cooling) increases inwardly in the radial direction. As a result of this preferential melting-solidification, during the final stage of solidification (or cooling), silicon located along the central plane of the focal volume has insufficient strength to withstand the contraction stresses generated by the neighbouring molten (or heated) silicon as the molten (or heated) silicon solidifies (cools) inwardly in the radial direction. Therefore, a crack 11 is produced during the melting-solidification (or heating-cooling) process, which initially propagates from the surface of the wafer 2 and then spreads to the bottom of the wafer 2, thereby allowing the cutting or dicing of the silicon wafer into individual silicon chips. The plane along which the crack is produced corresponds to the central plane of the focal volume. Furthermore, thermal effect zone is controlled within a single scan width of the pass due to the rapid moving of the wafer 2 relative to the laser beam 7.

The laser beam 7 diameter irradiated and deposited on the surface of the wafer 2 is reduced after passing through the beam shaper 29. Accordingly, the melting width W of the groove 10 on the surface of the wafer 2 is similarly reduced. Thus, the effects of a minimized cutting kerf and thermal effect in the laser-induced wafer dicing are achieved. In a preferred embodiment, the vacuum suction system works to extract the vapour and aerosols including plasma heating away from the cut kerf. The plume produced above the surface of the wafer 2 is therefore rapidly removed away as soon as they are produced. More preferably, the shielding plate 22 is placed above the surface of the wafer 2 leaving a gap between the wafer 2 and the shielding plate 22 to further protect the cut wafer 2 with a clean surface during the cutting process. The thermal heating from the laser-produced plume is reduced and the clean kerf sidewall is achieved during laser scanning.

As illustrated in FIG. 4, the laser beam 7 is scanned from one edge of the wafer 2 and moves towards the other opposing edge via the movement of the platform table 1 (not shown) controllable by the control device 8 (not shown). The initial localized crack generated at the localized spot 12 is gradually developed into a propagating crack following the directional movement of the moving spot 12. The crack line 11 corresponding to the melting track follows the preferential melting-solidification phenomenon described previously.

Thermal effect zone is controlled within a single scan width of the laser scan pass due to the rapid movement of the wafer 2 relative to the laser beam 7. The total width W of the laser-induced melting track including the thermal effect zone is the melting belt width of a single scan pass of the laser beam 7. The other thermal effect region is significantly invisible in the laser beam 7 irradiation track except the melting belt, i.e. only the wafer constrained within the melting belt is melted (or heated), solidified (or cooled) and cracked.

The width W is strongly dependent on the operating laser parameters during the cutting process. In one embodiment, when a focusing lens (FIG. 6) shown in FIG. 5 having a focal length of 100 mm is applied, the obtained width W for a wafer thickness of 500 μm is 50 μm at a scanning speed of 60 mm/s with a laser power of 160 W operating at a repetition rate of 12 kHz and a duty cycle of 50%. For the same wafer thickness, the width W is reduced with increasing scanning speed and decreasing laser power. In comparison, the obtained width W is 50 μm at a scanning speed of 300 mm/s with a laser power of 180 W operating at repetition rate of 12 kHz and a duty cycle of 50% (pulse duration 41.6 μs). Laser power, scanning speed and the pulse frequency are the output parameters of a laser beam source and are therefore the interactive parameters to determine the cutting speed and the melting belt width W. The pulse frequency, pulse width and duty cycle may be tuned by the pulse modulator 20. The moving speed of the wafer correlates with the output power of the laser beam. That is to say, when the output power is constant and the moving speed is low, the melting belt width W becomes wider. And when the moving speed is constant and the output power is high, the melting belt width W becomes wider. At low laser pulse frequency, e.g. 3 kHz, a rough edge of the melting belt is obtained due to discontinuous connections of the laser melting spot 12 at a scanning speed of 60 mm/s with a laser power of 150 W. At an even further low laser pulse frequency, e.g. 1 kHz, a melting belt cannot be achieved due to discontinuous connections of the laser melting spot 12 at a scanning speed of 60 mm/s with a laser power of 150 W. Furthermore, in this latter case, transverse cracks in the radial direction are produced. Therefore, this shows that the laser beam parameters should be carefully selected and if not chosen appropriately, it may result in a failed cutting operation for separating the wafer.

The afore-described method and system provide several advantages over the prior art. The laser-induced melt-solidification (or thermal heating-cooling) process results in a crack from the top of the wafer to the bottom. At the same time, the crack propagates directionally along the central line of the melting track from one initial edge of the wafer towards the opposing edge with the laser beam scanning towards that direction. The wafer is automatically separated by the crack propagation with a single pass laser beam scanning without debris produced on the surface of the wafer.

A minimized kerf with a clean kerf sidewall and minimal thermal effect are achieved through the application of laser pulse modulator, beam shaper, and suction device.

Multi-pass scanning is not necessary for the laser cutting of wafer with the embodiments of the present invention, thereby saving operating time and costs.

The need for the application of an external force to separate the wafer after laser irradiation is dispensed with the embodiments of the present invention. Further, the high costs associated with the use of assist gas, water jet, protective film, drying process or external force are significantly reduced, if not totally eliminated, by a laser beam irradiation with the embodiments of the present invention.

The high cost associated with the use of expensive UV laser is reduced with the replacement of a long pulse fiber or solid-state laser having a wavelength of 1,064 nm to 1,550 nm.

Although the foregoing invention has been described in some detail by way of illustration and example, and with regard to one or more embodiments, for the purposes of clarity of understanding, it is readily apparent to those of ordinary skill in the art in light of the teachings of this invention that certain changes, variations and modifications may be made thereto without departing from the spirit or scope of the invention as described in the appended claims.

We claim:

1. A method for cutting a semiconductor wafer by generating a crack within the wafer, the method comprising:
    irradiating a pulsed laser beam having a long pulse duration time of 20 µs to 80 µs towards a surface of the wafer; and
    converging the laser beam to form a focal point so that a focal volume defined by the focal point and a boundary of the laser beam within the wafer is formed;
wherein energy encompassed within the focal volume causes the wafer located at a periphery of the focal volume to contract faster than the wafer located within the focal volume, thereby generating a crack within the wafer extending from said surface of the wafer to another surface of the wafer opposing said surface to cut the wafer.

2. The method of claim 1, wherein the focal point is formed below said surface of and within the wafer.

3. The method of claim 2, wherein energy encompassed within the focal volume causes the wafer located at the periphery of the focal volume to melt slower but to solidify faster and therefore to contract faster than the wafer located within the focal volume.

4. The method of claim 1, wherein the focal point is formed below and outside the wafer.

5. The method of claim 4, wherein energy encompassed within the focal volume causes the wafer located at the periphery of the focal volume to thermally heat up slower but to cool down faster and therefore to contract faster than the wafer located within the focal volume.

6. The method of claim 1, wherein the focal point is formed above said surface of and outside the wafer.

7. The method of claim 1, wherein the irradiating comprises irradiating a laser beam having a laser power density lower than a vapourisation threshold of the wafer ablation.

8. The method of claim 1, further comprising guiding the laser beam towards said surface of the wafer prior to converging the laser beam to form the focal point.

9. The method of claim 1, further comprising expanding the laser beam prior to converging the laser beam.

10. The method of claim 1, further comprising shaping and simultaneously converging the laser beam to form a converged laser beam having uniform and concentrated power distribution on said surface of the wafer.

11. The method of claim 1, further comprising providing a vacuum suction system to remove vapours and melting droplets produced when the wafer melts.

12. The method of claim 1, further comprising providing a shielding plate over said surface of the wafer to maintain said surface of the wafer clean.

13. The method of claim 12, wherein the wafer is silicon.

14. The method of claim 1, further comprising moving the wafer in a predetermined direction so that the crack generated within the wafer propagates in a direction corresponding to the moving direction of the wafer.

15. The method of claim 1, wherein the irradiating comprises irradiating a laser beam having a pulse repetition rate between 5 kHz and 50 kHz.

16. The method of claim 1, wherein the irradiating comprises irradiating a laser beam having an infrared wavelength between 1,064 nm and 1,550 nm.

17. The method of claim 1, wherein the irradiating comprises irradiating a laser beam having a laser power of at most 400 W.

18. The method of claim 1, wherein the wafer is selected from the group consisting of silicon (Si), Si coated with a layer of oxide, nitride, carbide, or metal, gallium arsenide (GaAs), silicon carbide (SiC), silicon nitride (SiN), indium phosphide (InP) and a mixture thereof.

19. The method of claim 1, wherein the wafer has a thickness between 100 µm and 1,500 µm.

20. The method of claim 1 in which the laser beam has a wavelength of 1064 nanometers to 1550 nanometers and a long pulse duration time of 40 µs and 42 µs.

21. The method of claim 1 further comprising converging the laser beam to form a focal point spaced apart from said surface of the wafer so as to induce thermal heating of the wafer.

22. The method of claim 1, wherein said surface is a top surface of the wafer and said another surface is a bottom of the wafer.

23. A system for cutting a semiconductor wafer by generating a crack with in the wafer, the system comprising:
    a laser beam source for irradiating a pulsed laser beam having a long pulse duration time of 20 µs to 80 µs towards a surface of the wafer; and
    a converging lens to converge the laser beam to form a focal point so that a focal volume defined by the focal point and a boundary of the laser beam within the wafer is formed;
wherein energy encompassed within the focal volume causes the wafer located at a periphery of the focal volume to contract faster than the wafer located within the focal volume, thereby generating a crack within the wafer extending from said surface of the wafer to another surface of the wafer opposing said surface to cut the wafer.

24. The system of claim 23, wherein the focal point is formed below said surface of and within the wafer.

25. The system of claim 24, wherein energy encompassed within the focal volume causes the wafer located at the periphery of the focal volume to melt slower but to solidify faster and therefore to contract faster than the wafer located within the focal volume.

26. The system of claim 23, wherein the focal point is formed below and outside the wafer.

27. The system of claim 26, wherein energy encompassed within the focal volume causes the wafer located at the periphery of the focal volume to thermally heat up slower but to cool down faster and therefore to contract faster than the wafer located within the focal volume.

28. The system of claim 23, wherein the focal point is formed above said surface of and outside the wafer.

29. The system of claim 23, further comprising a laser beam guide to guide or reflect the laser beam towards said surface of the wafer prior to converging the laser beam to form the focal point.

30. The system of claim 23, further comprising a beam expander to expand the laser beam prior to converging the laser beam.

31. The system of claim 23, further comprising a beam shaper to simultaneously shape and converge the laser beam to form a converged laser beam having uniform and concentrated power distribution on said surface of the wafer.

32. The system of claims 23, further comprising a vacuum suction system to remove vapours and melting droplets produced when the wafer melts.

33. The system of claim 23, further comprising a shielding plate over said surface of the wafer to maintain said surface of the wafer clean.

34. The system of claim 23, further comprising a control device coupled to the wafer so as to move the wafer in a predetermined direction so that the crack generated within the wafer propagates in a direction corresponding to the moving direction of the wafer.

35. The system of claim 23, further comprising a laser pulse generator or modulator coupled to the laser beam source to generate or modulate a pulse frequency of the laser beam.

36. The system of claim 23 in which the laser beam has a wavelength of 1064 nanometers to 1550 nanometers and a long pulse duration time of 40 µs and 42 µs.

37. The system of claim 23 further comprising converging the laser beam to form a focal point spaced apart from said surface of the wafer so as to induce thermal heating of the wafer.

38. The system of claim 23, wherein said surface is a top surface of the wafer and said another surface is a bottom of the wafer.

* * * * *